United States Patent [19]

George

[11] 4,358,830
[45] Nov. 9, 1982

[54] BUBBLE MEMORY WITH ENHANCED BIT DENSITY STORAGE AREA

[75] Inventor: Peter K. George, Morgan Hill, Calif.

[73] Assignee: National Semiconductor Corporation, Santa Clara, Calif.

[21] Appl. No.: 180,834

[22] Filed: Aug. 25, 1980

[51] Int. Cl.$^3$ ............................................. G11C 19/08
[52] U.S. Cl. ....................................... 365/39; 365/15
[58] Field of Search ............................ 365/15, 39, 12

[56] References Cited

U.S. PATENT DOCUMENTS

| | | | |
|---|---|---|---|
| 3,921,157 | 11/1975 | Sandfort | 365/43 |
| 3,967,002 | 6/1976 | Almasi et al. | 427/132 |
| 4,299,680 | 11/1981 | Fontana, Jr. | 365/39 |

OTHER PUBLICATIONS

Design and operation of a 550 kbit enhanced density 3 μm bubble memory chip by M. Y. Dimyan and W. C. Hubbell of Texas Instruments Incorporated, Central Research Laboratories, Dallas, TX 75265.

Primary Examiner—James W. Moffitt
Attorney, Agent, or Firm—Brown & Martin

[57] ABSTRACT

A field-access bubble memory chip has a plurality of permalloy elements overlying an insulating layer. The permalloy elements are configured and positioned to define a plurality of paths for propagating magnetic bubbles under the influence of a Z bias magnetic field and a rotating XY magnetic drive field. A first portion of the paths are located in control function areas of the chip and a second portion of the paths are located in a storage area of the chip. The period of the permalloy elements in the control function areas is substantially greater then the period of the permalloy elements in the storage area. The thickness of the insulating layer immediately beneath the permalloy elements is less in the storage area than in the control function areas. This difference in thickness is sufficient so that the propagation margins for magnetic bubbles in the control function areas and in the storage area are substantially equal. Thus the bit density in the storage area can be significantly increased by reducing the period of the elements therein without any net reduction in the overall margin of the chip.

1 Claim, 5 Drawing Figures

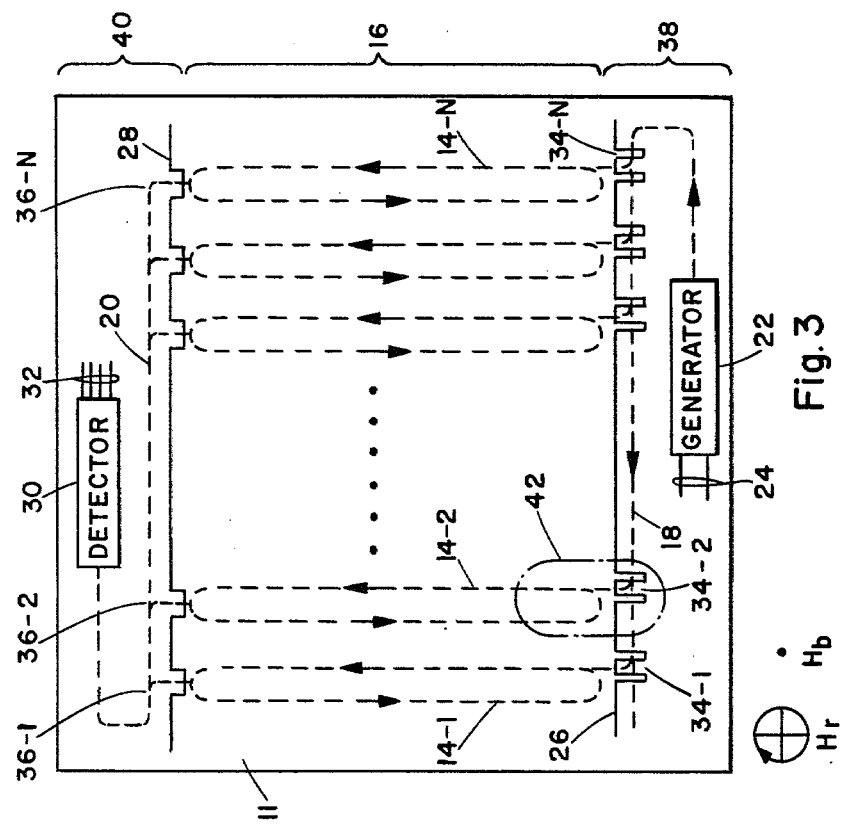
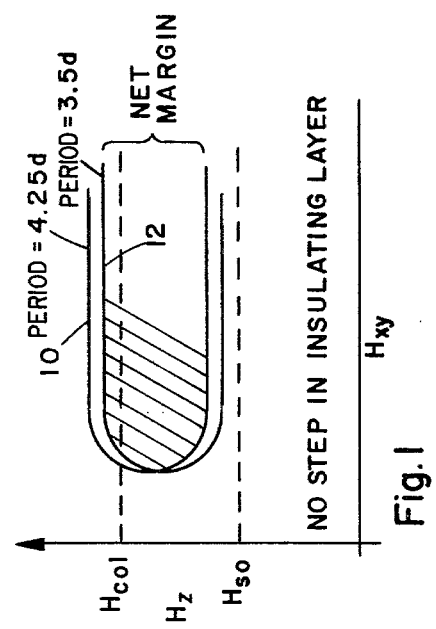
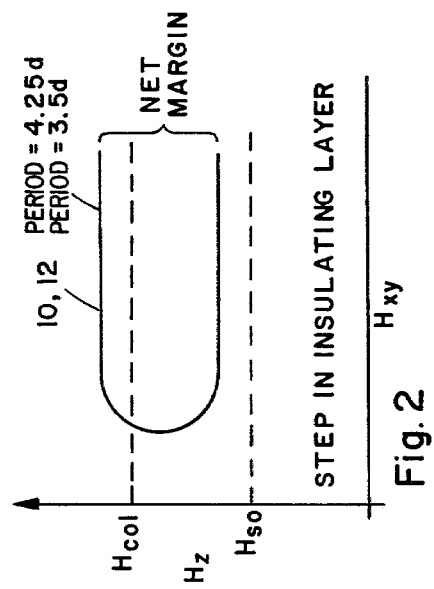

BUBBLE MEMORY WITH ENHANCED BIT DENSITY STORAGE AREA

BACKGROUND OF THE INVENTION

The present invention relates to magnetic bubble memories, and more particularly to methods of increasing the information bit storage capacity for given chip sizes.

A conventional field-access magnetic bubble memory includes a plurality of permalloy propagation elements which overlie a film of magnetic garnet. The permalloy elements are typically configured in the shape of assymmetric chevrons or C-bars which are positioned relative to one another to define a plurality of paths. These paths are adapted for having magnetic bubble domains propagated along the same under the influence of Z-bias magnetic field and an in-plane rotating XY magnetic drive field. In most existing and proposed bubble memory chips, the magnetic bubbles travel along major and minor loops. Usually, a surplus of minor loops are included in the on-chip memory architecture to provide built-in redundancy that is vital if decent chip yields are to be obtained with high storage capacity chips. The loops can be arranged in various ways, but their organization is typically dictated by the active components of the chip—the bubble generators, replicators, detectors, and gates for transferring bubbles between the major and minor loops. These components in turn will be affected by increasing the information bit storage capacity of the chip.

There is an ongoing effort to increase the information bit storage capacity for given bubble memory chips sizes. To a limited extent, this will reduce the overall physical size of a memory system incorporating a plurality of bubble memory chips. However, the primary motivating reason for this ongoing effort is to achieve a reduction in the memory system price per bit. By way of example, if the size of a one megabit bubble memory chip can be reduced from 400 mils on a side to 350 mils on a side, then a significantly larger number of individual bubble memory chips can be simultaneously fabricated on a single wafer. Generally, the price per storage bit decreases as the number of memory chips of a given storage capacity produced from a given wafer size increases.

In most conventional field-access bubble memories, the active components and the paths leading to and from the same are located in a plurality of control function areas which are typically the peripheral regions of the chip. The propagation paths which comprise the plurality of data storage loops are usually located in a medial or central portion of the chip. Usually a major portion of the chip area is devoted to the data storage loops. If any significant increase in the information bit storage capacity for a given chip size is to be achieved, the bit density in the storage area must be increased.

A number of problems arise when seeking to increase the bit density in the storage area. First of all, in order to form propagation paths, it is necessary to form a gap between adjacent permalloy propagation elements. The gap size is typically only one half to two thirds of the bubble diameter (d). Presently, current materials growth technology and photolithographic resolution limits establish a lower limit for d of approximately 1.5 to 2 microns. Furthermore, magnetic bubbles must be spaced apart by about 4d, or 6 to 8 times the gap. This spacing is necessary to avoid adjacent bit interaction. If the bubbles are too close together, they tend to self bias each other and collapse.

A conventional design rule for field-access bubble memories employing assymmetric chevron or C-bar permalloy elements is that the period (p) should equal approximately 4.25 times d. The period is the length of the element from tip to tip. A theoretical lower limit for the storage area required for one bit, herein referred to as the storage cell, is approximately $p^2$. These design rules yield good bubble propagation margins in terms of wide Z-bias ranges and low magnitudes for the required drive fields.

Heretofore, Texas Instruments, Inc. has reduced the period in the storage area relative to the control function areas. However, this has resulted in an undesirable net margin reduction. It is believed that a similar approach has been taken in one design of International Business Machines Corporation. In that design, along with the period difference the garnet film was made approximately 2 microns in the control function areas and approximately 1.5 microns in the storage area. Varying the thickness of the garnet film in this way offsets the net margin reduction that would otherwise occur because of the reduced period in the storage area. However, it is believed that the garnet film is thinned in the storage area by ion milling and this presents further problems in terms of uniform bubble integrity.

SUMMARY OF THE INVENTION

It is therefore an object of the present invention to provide a bubble memory with an enhanced bit density storage area.

Another object of the present invention is to eliminate the margin reduction normally accompanying storage cell size reduction in a bubble memory.

Another object of the present invention is to reduce the cost per information bit in a bubble memory.

A still further object of the present invention is to provide a process of fabricating a bubble memory with an enhanced bit density storage area.

The magnetic bubble memory chip of the present invention incorporates the monolithic architecture of a conventional field-access bubble memory having control function areas adjacent the peripheral edges of the chip and a storage area in the medial portion of the chip. The sequence of layers from bottom to top is essentially: garnet film, first layer of silicone dioxide, patterned controlled conductors, second insulating layer of silicone dioxide, and permalloy propagation elements. The permalloy elements are configured and positioned to define a plurality of paths for propagating magnetic bubbles having a predetermined diameter d under the influence of a Z-bias magnetic field and a rotating XY drive magnetic field. A first portion of the paths are located in the control function areas and lead to and away from the active components of the chip. A second portion of the paths are located in the medial storage area of the chip and preferable define a plurality of data storage loops. The period p of the permalloy elements in the control function areas is substantially greater than the period of the permalloy elements in the storage area. To eliminate any net reduction in the propagation margin that would otherwise result from the different values of p for the control function areas and the storage area, the thickness of the second insulating layer in the storage area of the chip is less than the thickness of the second insulating layer in the control function areas.

This difference in thickness is in an amount sufficient so that the propagation margins for magnetic bubbles having a diameter d are substantially equal for both the control function areas and the storage area.

BRIEF DESCRIPTION OF THE DRAWINGS

FIG. 1 is a graph depicting margin curves for a field-access bubble memory fabricated without the teachings of the present invention in which p equals 4.25d in the control function areas and p equals 3.5d in the storage area.

FIG. 2 is a graph depicting the margin curves for a field-access bubble memory fabricated in accordance with the teachings of the present invention in which p equals 4.25d in the control function areas and p equals 3.5d in the storage area, and wherein the insulating layer directly beneath the permalloy elements in the storage area has been thinned to offset the net margin reduction which would otherwise result due to the period difference.

FIG. 3 is a schematic diagram of a bubble memory chip fabricated in accordance with the present invention.

Unless otherwise indicated, like reference numerals throughout the figures indicate like parts. The relative dimensions in the figures are not to scale.

DESCRIPTION OF THE PREFERRED EMBODIMENT

Figure 5:
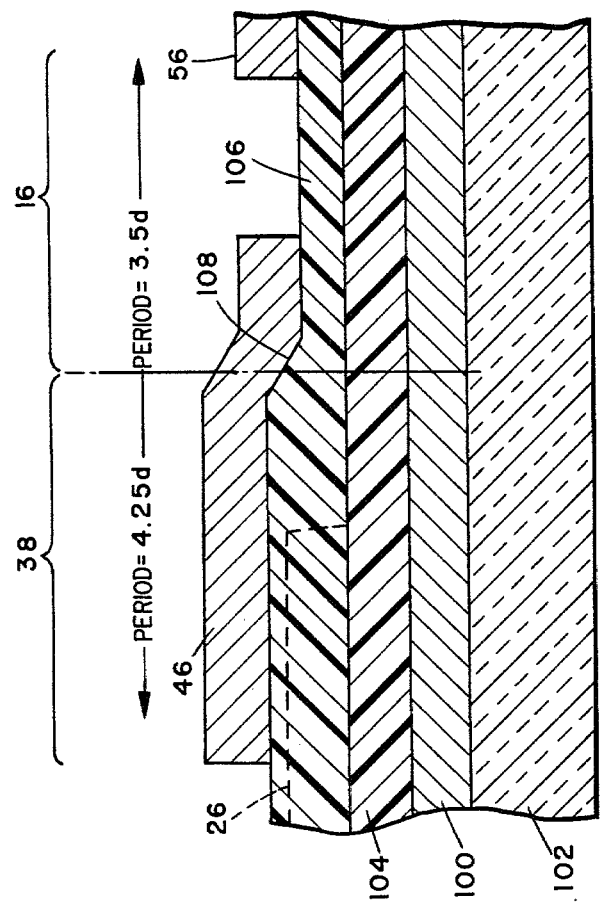
FIG. 5 is an enlarged fragmentary vertical sectional view taken along line 5—5 of FIG. 4.

In order to build a one megabit bubble memory chip using conventional lithography on a chip measuring approximately 350 mils on a side, it will be necessary to shrink the storage cell assuming that 2 micron bubbles are used with conventional field-access ground rules (p equals 4.25d and minimum feature size equals 2d/3.3). A two micron bubble size currently represents a lower limit to conventional field-access bubble memory design from the standpoint of materials growth and photolithography techniques. Table 1 below summarizes the tradeoff between bubble size, chip size and resolution requirements under the conventional p equals 4.25d design rule. For the given parameters, Table 1 sets forth approximate bit storage capacities on a chip measuring 375 mils by 375 mils allowing for a 10% redundancy in the data storage loops, i.e. assuming 90% of the loops are utilized.

TABLE I

| BUBBLE SIZE (d) IN MICRONS | BIT STORAGE CAPACITY | MINIMUM FEATURE SIZE (2d/3.3) IN MICRONS | STORAGE CELL AREA ($p^2$) IN SQUARE MICRONS | PERIOD (p=4.25d) IN MICRONS |
|---|---|---|---|---|
| 2.7 | 549 K | 1.64 | 132.25 | 11.5 |
| 2.4 | 698 K | 1.45 | 104.0 | 10.2 |
| 2.0 | 1004 K | 1.21 | 72.25 | 8.5 |
| 1.8 | 1240 K | 1.09 | 58.5 | 7.6 |

By way of example, Table I indicates that if the bubble size is 2.4 microns, then the minimum feature size will be 1.45 microns, the period will be 10.2 microns, the storage cell area will be 104 microns and the bit storage capacity on a 375 mils by 375 mils chip, assuming 10% redundant loops, will be approximately 698 K.

If the period could be reduced to approximately 3.5d, then a one megabit storage capacity could be achieved in an area of only 325 mills by 325 mils, under significantly less stringent resolution tolerances. Merely reducing the period in the storage area in order to squeeze bubbles of a given size together to accomplish this goal without otherwise altering the construction of the memory results in an undesirable net reduction of the propagation margin for the chip. This can be better understood by way of reference to the margin data depicted graphically in FIG. 1. In FIGS. 1 and 2 the magnitude of the Z-bias field ($H_z$) is indicated along the vertical axis and the magnitude of the XY drive field ($H_{XY}$) is given along the horizontal axis. The notation $H_{col}$ indicates the magnitude of the Z-bias field at which the magnetic bubble domains collapse. The notation $H_{so}$ indicates the magnitude of the Z-bias field at which the magnetic bubble domains strip out.

In FIG. 1, the curve 10 is representative of the propagation margin where p=4.25d. The curve 12 is representative of the propagation where p=3.5d. As previously indicated above, in the prior art there has been an attempt to increase storage capacity for a given chip size merely by reducing the period in the medial storage area while maintaining the standard period of 4.25d in the peripheral control function areas. Inspection of FIG. 1 reveals that this prior art approach results in a net margin reduction for the bubble memory chip due to the non-overlap of the curves 10 and 12. The net margin that results is the shaded area commonly between both of the curves 10 and 12. It is estimated that for a typical memory the net margin reduction resulting from this approach would be approximately 4 Oersteds out of potential 20 Oersteds.

According to the present invention, the insulating layer immediately below the storage loops is made thinner in the medial storage area than in the peripheral control function areas of the chip. This compensates for any net margin reduction which would otherwise occur as a result of the period difference between the control function and storage areas, as illustrated in FIG. 2. The thickness of the insulating layer in the storage area of the chip which lies directly beneath the permalloy elements can be made less than the thickness of the same insulating layer in the control function areas by an amount sufficient so that the propagation margin curves 10 and 12 for the control function and storage areas of the chip are substantially equal. Thus, as shown in FIG. 2, the margin curves 10 and 12 coincide. If the uppermost insulating layer of the bubble memory chip is thinned a sufficient degree in the storage area, the resulting net margin of the chip will be significantly wider than that of the prior art devices mentioned above. It is believed that the upward shift of the propagation margin curve 12 for the p=3.5d storage area is caused by the deepening of the magnetostatic potential wells under the permalloy elements which occurs as the permalloy-to-garnet spacing is reduced.

Table II below sets forth the significant increases in bit density and chip storage capacity for given bubble sizes which can be achieved if p is reduced to 3.5d in the storage area. The data in Table II is calculated for a chip size of 375 mils by 375 mils, assuming a 10% data storage loop redundancy.

TABLE II

| BUBBLE SIZE (d) IN MICRONS | BIT STORAGE CAPACITY | MINIMUM FEATURE SIZE (2d/3.3) IN MICRONS | STORAGE CELL AREA ($p^2$) IN SQUARE MICRONS | PERIOD (p=3.5d) IN MICRONS |
|---|---|---|---|---|
| 2.7 | 813 K | 1.64 | 89.3 | 9.45 |
| 2.4 | 1028 K | 1.45 | 70.56 | 8.4 |
| 2.0 | 1481 K | 1.21 | 49 | 7.0 |
| 1.8 | 1833 K | 1.09 | 39.6 | 6.3 |

Tables III and IV below set forth approximate storage capacities which can be achieved on specified chip sizes where p=3.5d. The data in Tables III and IV is illustrative of the storage capacity increases possible with the present invention.

TABLE III

| | CHIP SIZE | STORAGE CAPACITY |
|---|---|---|
| d = 2.0 microns | 300 × 300 mils | 948 K |
| p = 7.0 microns | 325 × 325 mils | 1112 K |
| gap = 1.2 microns | 350 × 350 mils | 1290 K |
| | 375 × 375 mils | 1481 K |

TABLE IV

| | CHIP SIZE | STORAGE CAPACITY |
|---|---|---|
| d = 2.4 microns | 300 × 300 mils | 658 K |
| p = 8.4 microns | 325 × 325 mils | 773 K |
| gap = 1.4 microns | 350 × 350 mils | 896 K |
| | 375 × 375 mils | 1028 K |
| | 400 × 400 mils | 1170 K |

For purposes of illustration, the present invention will be described in connection with the fabrication of a block replicate bubble memory chip shown schematically in FIG. 3. It should be understood, however, that the invention is not limited to this specific type of architecture, but in fact, may be applied to any bubble memory organization which includes control function areas where gates, bubble detectors, etc. are located and one or more storage areas where information bits are stored and which typically comprise a major portion of the chip area.

The bubble memory chip 11 of FIG. 3 includes a plurality of data storage loops 14-1 to 14-N. These storage loops are located in a storage area 16 of the chip which is the medial portion of the chip and comprises the major portion of its area. A serial-parallel input propagation path 18 and a parallel-serial output propagation path 20 are provided for input and output bubbles to and from the data storage loops 14, respectively. A bubble generator 22 generates a stream of bubbles representative of information in response to control signals applied to its input leads 24. Bubbles from generator 22 are propagated along the serial portion of the input path 18 in the direction indicated by the arrowhead on that path. Once the stream of bubbles is in alignment with the data storage loops 14, a transfer-in control conductor 26 can be pulsed to transfer bubbles into the data storage loops.

Bubbles representative of information are propagated around the loops 14, (FIG. 3) in a counter-clockwise direction as indicated by the arrow-heads. Bubbles can be output from the data storage loops by pulsing a transfer-out control conductor 28 to transfer bubbles from the loops onto the serial portion of the output path 20. The bubbles merged on the serial portion of the path 20 form a data stream which may be propagated to a bubble detector 30. Output signals representative of the bubbles read by the detector 30 are generated on output leads 32.

The active components of the bubble memory chip shown schematically in FIG. 3 include a plurality of transfer gates 34-1 to 34-N for swapping bubbles from the serial portion of the input path 18 into the data storage loops 14-1 to 14-N. A plurality of replicate gates 36-1 to 36-N are provided for replicating bubbles from the data storage loops onto the serial portion of the output path 20. The active components of the bubble memory chip including the gates and the bubble detector are located in control function areas 38 and 40 adjacent the bottom and top peripheral edges of the chip.

As is conventional, the bubble memory of FIG. 3 includes a garnet film and a plurality of overlying permalloy elements which are configured and positioned to define a plurality of paths for propagating magnetic bubbles. These paths include the serial portions of the input and output paths 18 and 20 which are in the control function areas 38 and 40 and the data storage loops 14-1 to 14-N which are in the storage area 16. The maintenance and propagation of magnetic bubbles in the garnet film and along the paths is accomplished under the influence of a Z-bias magnetic field $H_b$ and a rotating XY drive magnetic field $H_r$.

In order to increase the storage capacity of the bubble memory chip 11, the period of the propagation elements which make up the data storage loops is made substantially smaller than the period of the permalloy elements defining the propagation paths in the control function areas. For example, in the storage area 16, p may equal approximately 3.5d and in the control function areas 38 and 40, p may equal 4.25d.

Figure 4:
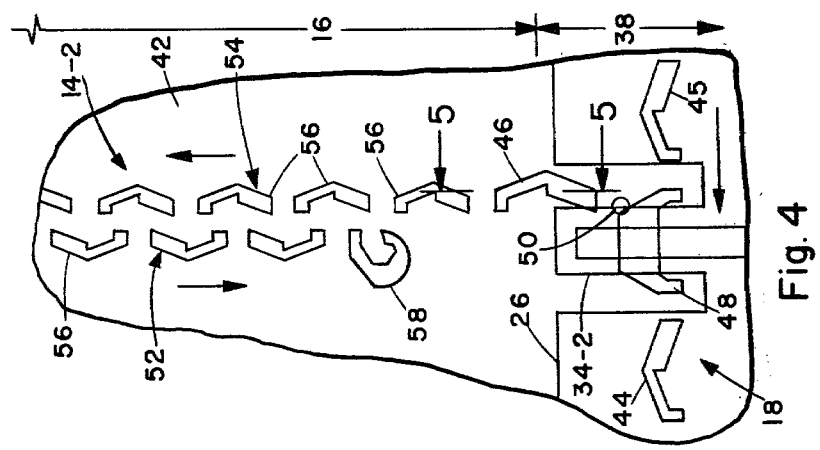
FIG. 4 is an enlarged plan view of a portion of the bubble memory chip of FIG. 3.

A portion 42 of the bubble memory of FIG. 3 is illustrated in enlarged plan form in FIG. 4. There the serial-parallel input path 18 is shown as including assymmetric chevron permalloy propagation elements 44-46 and a C-bar permalloy propagation element 48.

The elements 44-48 have a period which equals approximately 4.25 times the diameter (d) of the magnetic bubbles which are propagated in the memory. One of these bubbles is indicated with the circle 50 in FIG. 4. When a suitable signal is applied to the transfer-in control conductor 26, a magnetic bubble in the position of the bubble 50 on the C-bar 48 can be propagated onto the chevron 46 and then into the data storage loop 14-2. Thus the arrangement of propagation elements and the adjacent control conductor shown in FIG. 4 comprise the transfer-in gate 34-2.

The data storage loop 14-2 is comprised of two separate legs 52 and 54 each made of a sequence of spaced apart assymmetric chevron permalloy propagation elements 56 having a period which equals approximately 3.5 times the bubble diameter (d). A three-quarter disc permalloy propagation element 58 couples the legs 52 and 54 of the loop 14-2 and magnetic bubbles can propagate around the loop in the direction indicated by the arrow in FIG. 4 under the influence of the rotating drive field $H_r$.

As is conventional, the central axes of the chevron elements 56 in the leg 52 are longitudinally offset from the axes of the chevron elements 56 in the other leg 54 (FIG. 4). This interfitting relationship enables the legs of the data storage loop 14-2 to be positioned close to each other without danger of bubbles jumping between the legs. Thus, it will be understood that in the bubble memory chip of FIG. 3, the period of the permalloy elements in the propagation paths in the peripheral control function areas is approximately 4.25 times the bubble diameter. The period of the permalloy elements in the propagation paths in the storage area is approximately 3.5 times the bubble diameter. Therefore, the storage capacity of the chip and the bit density in the storage area is significantly larger than if the period of the elements were the usual 4.25 times d.

In order that there be no net reduction in the overall propagation margin for the bubble memory chip of FIG. 3, a special fabrication process must be followed. Essentially, the fabrication process is conventional except that the insulating layer immediately beneath the propagation elements is thinned in the storage area by an amount sufficient so that the propagation margin for the control function areas and the storage areas will be substantially equal.

The fabrication of the bubble memory depicted in FIGS. 3 and 4 begins with the epitaxial growth of a magnetic garnet layer 100 (FIG. 5) on top of a substrate 102 made of a suitable material such as gadolinium gallium garnet. Thereafter, an ion implantation step is used to suppress "hard" bubbles. Next, a first insulating layer 104 is deposited over the garnet layer 100 by any conventional technique, such as vacuum deposition, sputtering, or RF plasma deposition. This first insulating layer may be made of silicon dioxide and may have a thickness of approximately 1,000 to 5,000 angstroms. Unless otherwise indicated, throughout the discussion of the fabrication process, each of the layers covers the entire chip area including the storage area 16, and the control functioning areas 38 and 40 (See FIG. 3).

Next, a layer of an electrically conductive material such as Al-Cu or gold (not shown) is deposited on top of the first insulating layer 104. This layer may have a thickness of approximately 3,000 angstroms to approximately 4,000 angstroms and may be deposited at approximately 200 C. Thereafter, the Al-Cu layer is ion-milled to form a pattern of control conductors preferable having tapered edges, such as the transfer-in control conductor 26 shown in FIGS. 3 and 4. Preferably the control conductors extend only in the control function areas of the chip adjacent the peripheral edges of the chip. This will permit the thinning of the second insulating layer in the storage area which is used to offset a net margin reduction that would otherwise occur because of the reduced period in that area. The control conductors may be made of other electrically conductive materials such as gold. These conductors are used to control bubble generation, transfer, replication, annihilation, etc.

Next, a second insulating layer 106 (FIG. 5) is deposited over both the pattern of control conductors and the first insulating layer 104. This second insulating layer is also preferably made of silicon dioxide. When deposited, it will preferably yield a permalloy to garnet spacing, of 5,000 angstroms plus or minus 5%. Thereafter, the thickness of the second insulating layer 106 is reduced in the storage area 16 (FIGS. 3 and 4) by an amount sufficient so that the propagation margin for bubbles in the storage area 16 of the completed memory will be substantially equal to the propagation margin for bubbles in the control function areas 38 end 40 of the completed memory. Where p equals 4.25d in the control function areas and p=3.5d in the storage area, it has been determined that the thickness of the second insulating layer should yield a permalloy to garnet spacing of approximately 3,000 angstroms in the storage area 16, and should yield 5,000 angstroms in the control function areas 38 and 40. These thicknesses will ensure that there be no net reduction in the overall propagation margin for the completed memory. Finally, a layer of permalloy (not shown) of suitable thickness, e.g. 4,000 to 5,000 angstroms deposited over the second insulating layer 106. This permalloy layer is etched via photolithgraphic techniques to produce the various propagation elements, such as 46 and 56, which form the various propagation elements, such as 46 and 56, which form the various propagation paths on the chip.

The thickness of the second insulating layer 106 may be reduced in the storage area 16 by conventional techniques such as ion milling or chemical etching. Preferably the upper surface 108 (FIG. 5) of the junction between the portions of the second insulating layer in the control function areas 38 and 40 and the storage area 16 is inclined. This inclination minimizes the likelihood that bubbles will not propagate along permalloy elements such as 46 which bridge the control function and storage areas and have steps therein. It would be difficult to produce the inclined surface 108 by chemical etching. Ion milling or some other suitable technique may be utilized. Preferably the surface 108 inclines gradually, e.g. at a rate of approximately 15 percent. This ensures that bubble propagation along stepped permalloy elements such as 46 will not be impeded.

Having described a preferred embodiment of the enhanced density bubble memory it will be apparent to those skilled in the art that the invention permits of modification in both arrangement and detail. Therefore my invention should be limited only in accordance with the scope of the following.

I claim:

1. A magnetic bubble memory chip comprising:
   a garnet film;
   a first insulating layer made of silicon dioxide overlying the garnet film;
   a pattern of control conductors made of an electrically conductive material overlying the first insulating layer and extending in a plurality of control function areas of the chip adjacent the peripheral edges of the chip;
   a second insulating layer made of silicon dioxide overlying the control conductors and the first insulating layer, the second insulating layer having a thickness in the control function areas of the chip to yield a permalloy to garnet spacing of 5,000 angstroms, a thickness in a storage of the chip located in the medial portion thereof to yield a permalloy to garnet spacing of 3,000 angstroms, and a junction having an inclined upper surface between the portions of the second insulating layer in the control-function areas and the storage area; and
   a plurality of permalloy elements overlying the second insulating layer, the permalloy elements being configured and positioned to define a plurality of paths for propagating magnetic bubbles having a diameter of approximately 1.5 to 2 microns under the influence of a Z-bias magnetic field and a rotating magnetic drive field,
   a first portion of the paths being located in the control function areas and a second portion of the paths being located in the storage area,
   the period of the permalloy elements in the control function areas being approximately 4.25 times the diameter of the magnetic bubbles, and the period of the permalloy elements in the storage area being approximately 3.5 times the diameter of the magnetic bubbles;

whereby the bit density in the storage area of the chip will be significantly greater than that in the control function areas of the chip while the propagation margins for the magnetic bubbles in the control function areas and the storage area will be substantially equal.

* * * * *